United States Patent
Hannaway et al.

(10) Patent No.: US 8,792,142 B2
(45) Date of Patent: *Jul. 29, 2014

(54) METHODS AND SYSTEMS FOR CREATING STRUCTURAL DOCUMENTS HAVING CONTACT INFORMATION FOR UTILIZING PRODUCT INFORMATION

(75) Inventors: William J. Hannaway, Webster, NY (US); William J. Nowak, Webster, NY (US); Cynthia J. Ryan, Lima, NY (US); Stephen C. Morgana, Rochester, NY (US); James Milo Sweet, Rochester, NY (US); Reiner Eschbach, Webster, NY (US)

(73) Assignee: Xerox Corporation, Norwalk, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 13/594,138

(22) Filed: Aug. 24, 2012

(65) Prior Publication Data

US 2014/0055822 A1 Feb. 27, 2014

(51) Int. Cl.
| | |
|---|---|
| H04N 1/40 | (2006.01) |
| G06F 19/00 | (2011.01) |
| G06F 7/66 | (2006.01) |
| G06F 17/00 | (2006.01) |

(52) U.S. Cl.
USPC ............ 358/3.28; 700/98; 700/118; 700/127; 700/163; 700/236

(58) Field of Classification Search
None
See application file for complete search history.

(56) References Cited

U.S. PATENT DOCUMENTS

| | | | |
|---|---|---|---|
| 7,788,883 B2 | 9/2010 | Buckley et al. | |
| 7,983,792 B2 | 7/2011 | Gombert et al. | |
| 2008/0225334 A1 | 9/2008 | Hamada et al. | |
| 2009/0024490 A1 | 1/2009 | Satterfield | |
| 2009/0279110 A1 | 11/2009 | Ito | |
| 2009/0282782 A1 * | 11/2009 | Walker et al. | 53/410 |
| 2009/0287632 A1 | 11/2009 | Gombert et al. | |
| 2010/0058943 A1 | 3/2010 | Bober | |
| 2010/0110479 A1 | 5/2010 | Gombert et al. | |
| 2010/0222908 A1 | 9/2010 | Gombert et al. | |
| 2010/0231956 A1 | 9/2010 | Liu et al. | |
| 2011/0054849 A1 | 3/2011 | Walker et al. | |
| 2011/0149337 A1 | 6/2011 | Goetz et al. | |
| 2012/0015789 A1 | 1/2012 | Harrington | |
| 2013/0120767 A1 | 5/2013 | Mandel et al. | |
| 2013/0120770 A1 * | 5/2013 | Mandel et al. | 358/1.9 |

FOREIGN PATENT DOCUMENTS

| | | |
|---|---|---|
| EP | 1557795 A3 | 7/2005 |
| EP | 1847396 A1 | 10/2007 |
| JP | 2009226716 A | 10/2009 |

* cited by examiner

*Primary Examiner* — Firmin Backer
*Assistant Examiner* — Henok A Shiferaw
(74) *Attorney, Agent, or Firm* — Fox Rothschild LLP

(57) ABSTRACT

A method may include determining a shape of a structural document, determining a plurality of dimensions of the structural document, receiving information associated with one or more content items, receiving contact information to include on the structural document, receiving an indication of a location on the structural document where the contact information is to be displayed, and causing a graphical representation of the structural document to be displayed at a computing device. A shape and dimensions of the graphical representation may correspond to the determined shape and dimensions, the contact information may be displayed on the graphical representation at the location, and the graphical representation may include at least a portion of the received content items. The method may include receiving an indication that a user is finished creating the structural document, generating a print document including an encoded data mark, and providing the print document to print-related devices.

20 Claims, 12 Drawing Sheets

METHODS AND SYSTEMS FOR CREATING STRUCTURAL DOCUMENTS HAVING CONTACT INFORMATION FOR UTILIZING PRODUCT INFORMATION

This application is related to U.S. patent application Ser. No. 13/594,066 filed Aug. 24, 2012, U.S. patent application Ser. No. 13/594,103 filed Aug. 24, 2012, and U.S. patent application Ser. No. 13/594,172 filed Aug. 24, 2012.

BACKGROUND

Creating customizable structural documents or other items using large commercial printers or low volume printers is often inefficient for short runs due to labor, set-up time and overhead costs. Traditionally, print service providers might even have refused to create structural documents in short runs because having a die fabricated for a short run was not cost effective. In addition, the development of a structural design required investment in sophisticated and often expensive design software. Moreover, print service providers were often resigned to perform the finishing of structural documents manually, which is a potentially error-prone and labor-intensive approach.

SUMMARY

This disclosure is not limited to the particular systems, methodologies or protocols described, as these may vary. The terminology used in this description is for the purpose of describing the particular versions or embodiments only, and is not intended to limit the scope.

As used in this document, the singular forms "a," "an," and "the" include plural reference unless the context clearly dictates otherwise. Unless defined otherwise, all technical and scientific terms used herein have the same meanings as commonly understood by one of ordinary skill in the art. All publications mentioned in this document are incorporated by reference. All sizes recited in this document are by way of example only, and the invention is not limited to structures having the specific sizes or dimensions recited below. Nothing in this document is to be construed as an admission that the embodiments described in this document are not entitled to antedate such disclosure by virtue of prior invention. As used herein, the term "comprising" means "including, but not limited to."

In an embodiment, a method of creating a structural document may include determining, by a host computing device in a cloud system, a shape of a structural document, determining, by the host computing device, a plurality of dimensions of the structural document, receiving, by the host computing device, information associated with one or more content items, receiving, via a communications network from a user computing device that is remote from the host computing device, contact information to include on the structural document, receiving, by the host computing device, an indication of a location on the structural document where the contact information is to be displayed, and causing a graphical representation of the structural document to be displayed at a user computing device. A shape of the three-dimensional graphical representation may correspond to the determined shape, a plurality of dimensions of the graphical representation may correspond to the determined plurality of dimensions, the contact information may be displayed on the graphical representation at the location, and the graphical representation may include at least a portion of the received content items. The method may include receiving, from the user computing device by the host computing device, an indication that a user is finished creating the structural document, generating a print document including an encoded data mark, and providing the print document to one or more print-related devices.

In an embodiment, a system for creating a structural document may include a computing device and a computer-readable storage medium in communication with the computing device. The computer-readable storage medium may include one or more programming instructions that, when executed, cause the computing device to determine a shape of a structural document, determine a plurality of dimensions of the structural document, receiving information associated with one or more content items, receive contact information to include on the structural document, receive an indication of a location on the structural document where the contact information is to be displayed, and cause a three-dimensional graphical representation of the structural document to be displayed at a user computing device. A shape of the three-dimensional graphical representation may correspond to the determined shape, a plurality of dimensions of the three-dimensional graphical representation may correspond to the determined plurality of dimensions, the contact information may be displayed on the graphical representation at the location, and the three-dimensional graphical representation may include at least a portion of the received content items. The computer-readable storage medium may include one or more programming instructions that, when executed, cause the computing device to receive an indication that a user is finished creating the structural document, generate a print document including an encoded data mark, and provide the print document to one or more print-related devices.

DETAILED DESCRIPTION

Figure 1:
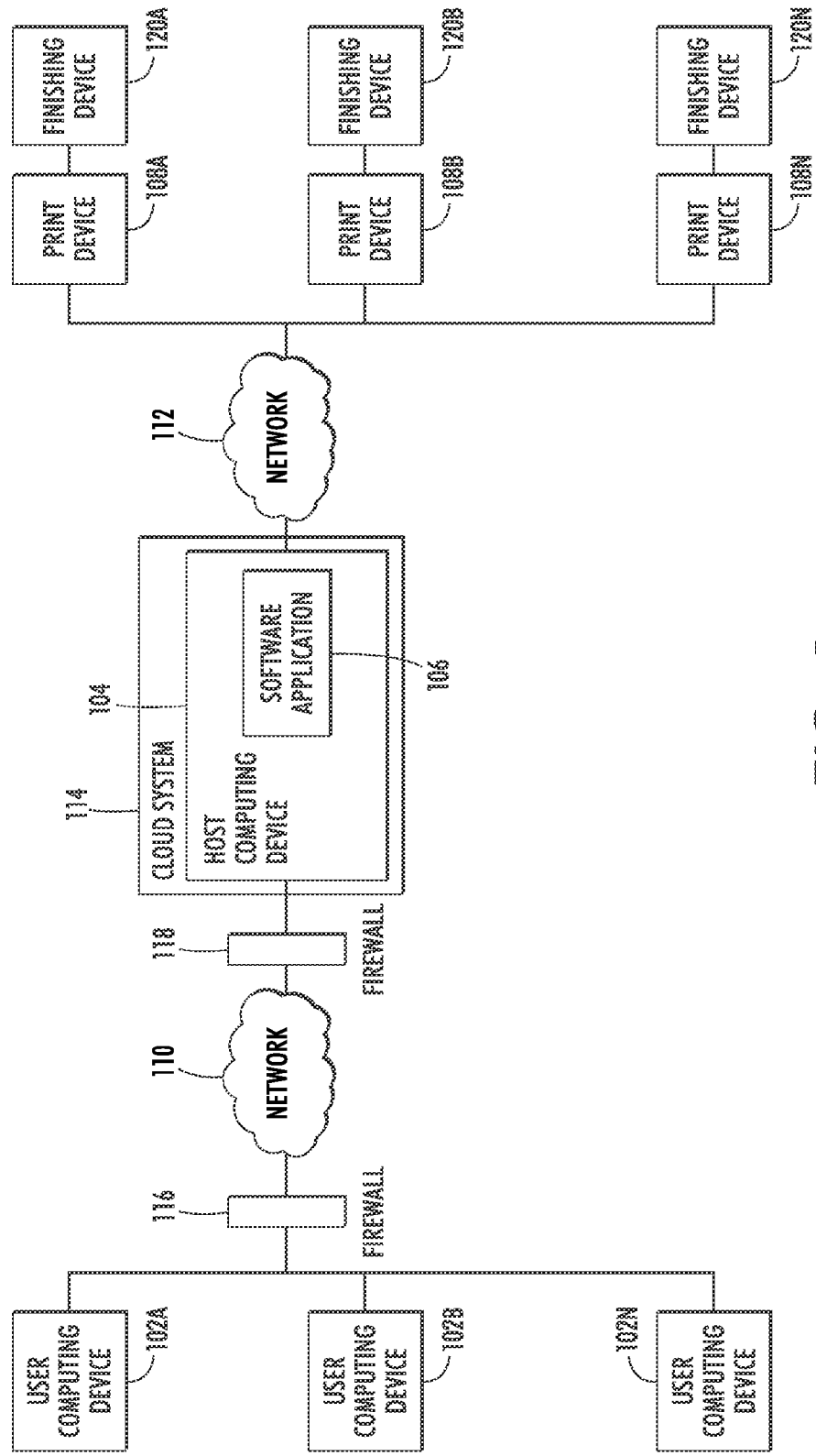
FIG. 1 illustrates a block diagram of a cloud system according to an embodiment.

The following terms shall have, for purposes of this application, the respective meanings set forth below:

A "brand identifier" refers to an identifier associated with a provider of a good and/or service such as, for example, a trade name, a trademark, or a logo.

A "cloud system" refers to one or more physical and/or logical devices that operate as a shared resource for multiple remote print-related devices and/or computing devices.

A "computing device" refers to a device that includes a processor and tangible, computer-readable memory. The memory may contain programming instructions that, when executed by the processor, cause the computing device to perform one or more operations according to the programming instructions. Examples of computing devices include personal computers, servers, mainframes, gaming systems, televisions, and portable electronic devices such as smartphones, personal digital assistants, cameras, tablet computers, laptop computers, media players and the like.

"Content information" refers to information pertaining to one or more contents of a structural document such as, for example, dimensions associated with the contents, a size of the contents, a weight of the contents and/or the like. Content information may include visual and/or textual information. For example, content information may include a picture and/or written description of one or more contents.

A "content item" is a visual characteristic of a structural document. For example, content items may include pictures, graphics, text, backgrounds, patterns, shading, shadowing, colors, color schemes, fonts, line types, embossing, cutouts, monograms, silhouettes and/or the like.

An "encoded data mark" refers to a printed mark that includes information that is human and/or machine readable.

A "finishing device" refers to a device capable of performing one or more finishing functions, operations or services on a print job. Finishing functions, operations or services may include, without limitation, cutting, binding, folding and/or the like. Examples of finishing devices may include a digital X-Theta or X-Y Cutter according to an embodiment.

A "firewall" is hardware and/or software used to protect a resource of one network from unauthorized external access.

A "logical device" is a representation of a physical device that uniquely identifies the corresponding physical device. For example, a network interface may be assigned a unique media access control address that is the logical unique identifier of a physical device. As such, a conventional device is a combined logical and physical device in which the logical device provides the entire identity of the physical device.

A "physical device" is a physical resource such as a computing device, a computer-readable storage medium and/or the like.

A "print device" refers to a device capable of performing one or more functions, operations and/or services on a print job. For example, a print device may provide print-related services for one or more print jobs. A print device may include a printer, multi-function device or other similar equipment that is capable of printing an image on physical media, such as, for example, paper, vinyl, labels and/or the like.

A "print document" refers to a physical document that includes print-related information.

A "print-related file" refers to an electronic file that includes information needed to print a hard copy of a document. Information in a print-related file may include, without limitation, cut information, crease information, glue information, fold information and/or the like.

A "print-related device" refers to a print device and/or a finishing device.

"Print-related information" refers to information pertaining to how a structural document is to be constructed on a physical medium. Print-related information may include, without limitation, cut, crease, glue and fold information.

A "product" refers to an item or other merchandise provided by a product provider to one or more end users. A product may be a physical and/or tangible item.

"Product information" is information related to a product, a structural document associated with the product, a product provider of the structural document and/or the product and/or the like.

A "product provider" refers to a provider of goods and/or services. A product provider may be the brand owner of goods and/or services. In an embodiment, a product provider may be a person or entity that provides goods and/or services on behalf of a brand owner.

The term "remote," as used herein with respect to computing devices and/or printing devices, refers to devices that operate on different computer networks and/or computer networks operated by different entities. For example, a computing device is remote from a printing device if the computing device is connected to a first LAN operated by a first entity and the printing device is connected to a second LAN operated by a second entity.

A "remote location" is a location physically and/or geographically distant from the location of a computing device. For example, if a computing device associated with a user is a home desktop computer, a remote location may be one that is geographically distant from the user's home.

A "resource" is a physical device comprising a processor and/or a storage medium. Examples of resources may include a computing device, a processing device, a storage device and/or the like.

A "shared resource" is a resource that may be accessed and used by a plurality of other resources.

A "structural document" is an item made of, for example and without limitation, paper, cardboard, vinyl, or other material which, for example and without limitation, printed material, cut lines and/or score lines may be applied. A structural document may be constructed by folding or otherwise manipulating a physical medium or physical media to provide three-dimensional features or to produce a three-dimensional package. Examples of structural documents may include gift boxes, gift bags, photo cubes, megaphones, ornaments, paper dolls and/or the like.

FIG. 1 illustrates a block diagram of a system 100 according to an embodiment. As illustrated by FIG. 1, a system may include a host computing device 104, a software application 106 located on the host computing device, a print device 108a-N and/or a finishing device 120a-N. Although FIG. 1 illustrates a print device 108a-N and a finishing device 120a-N as separate devices, it is understood that a print device and a finishing device may be the same device according to an embodiment.

The system may receive information from and send information to one or more user computing devices 102a-N. A user computing device 102a-N may be used to access a software application 106 hosted by the host computing device 104. A user computing device 102a-N may include a desktop computer, a laptop computer, a mobile computing device, a tablet computing device, a personal digital assistant and/or other computing devices.

In an embodiment, a host computing device 104 may be located remotely from a user computing device 102a-N. In an alternate embodiment, a host computing device 104 and a user computing device 102a-N may be the same device. A host computing device 104 may be a web server or other type of computing and/or processing device. In an embodiment, a user may access a software application 106 that is running on the host device from a user computing device 102a-N using a web browser. For example, a user may enter or select a URL address in a web browser on a user computing device 102a-N to access a software application 106 hosted by a host computing device 104. In an embodiment, a user may also be required to login or otherwise provide user authentication to a software application 106 hosted by a host computing device 104 by, for example and without limitation, providing a username and/or password.

In an embodiment, a user computing device 102a-N may be in communication with a host computing 104 device via a communication network 110. In various embodiments, the communication network 110 may be a local area network (LAN), a wide area network (WAN), a mobile or cellular communication network, an extranet, an intranet, the Internet and/or the like. In an embodiment, the communication network 110 may provide communication capability between a user computing device 102a-N and a host computing device 104. A user computing device 102a-N may communicate across the network 110 using any suitable communications protocol. For example, a user computing device 102a-N may communicate with a host computing device 104 via a wireless connection to a router that is connected to the Internet.

In an embodiment, the host computing device 104 may be part of a cloud system 114 as illustrated by FIG. 1. The cloud system 114 may be a shared resource, and may be in communication with a plurality of user computing devices 102a-N, as illustrated in FIG. 1. In an embodiment, each of the user computing devices 102a-N may be remote from each of the other user computing devices and the cloud system 114. In an embodiment, each of the user computing devices 102a-N may not communicate directly with the other user computing devices. In an embodiment, a user computing device 102a-N may communicate with the host computing device 104 through multiple firewalls. For example, referring to FIG. 1, a communication from a user computing device 102a-N to the host computing device 104 may pass through a firewall 116 associated with the user computing device and a firewall 118 associated with the cloud system 114.

In an embodiment, a print device 108a-N may communicate with a host computing device 104. In an embodiment, a print device 108a-N may be remote from one or more user computing devices 102a-N, other print devices and/or the cloud system 114. In an embodiment, a host computing device may be in communication with a print device via a communication network 112. In various embodiments, the communication network 112 may be a local area network (LAN), a wide area network (WAN), a mobile or cellular communication network, an extranet, an intranet, the Internet and/or the like. In an embodiment, the communication network 112 may provide communication capability between a host computing device 102a-N and a print device 108a-N. The host computing device 104 may communicate across the network 112 using any suitable communications protocol. In an embodiment, a host computing device 104 and/or a print device 108a-N may be associated with a print service provider. For example, a print service provider may both host a software application that is accessible by a user computing device 102a-N, and may operate one or more print devices 108a-N in the system.

In an embodiment, a finishing device 120a-N may be communicate with a host computing device 104 and/or one or more print devices 108a-N. In an embodiment, a finishing device 120a-N may be remote from one or more user computing devices 102a-N, one or more print devices 108a-N and/or the cloud system 114. In an embodiment, a host computing device may be in communication with a finishing device 120a-N via a communication network 112. In an embodiment, a finishing device 120a-N may be in communication with one or more print devices 108a-N via a communication network 122. The communication network 122 may be a local area network (LAN), a wide area network (WAN), a mobile or cellular communication network, an extranet, an intranet, the Internet and/or the like. In an embodiment, the communication network 122 may provide communication capability between a print device 108a-N and a finishing device 120a-N. In an embodiment, a print device 108a-N and a finishing device 120a-N may be associated with a print service provider. For example, a print service provider may operate a print device 108a-N and a finishing device 120a-N in the system.

Figure 2:
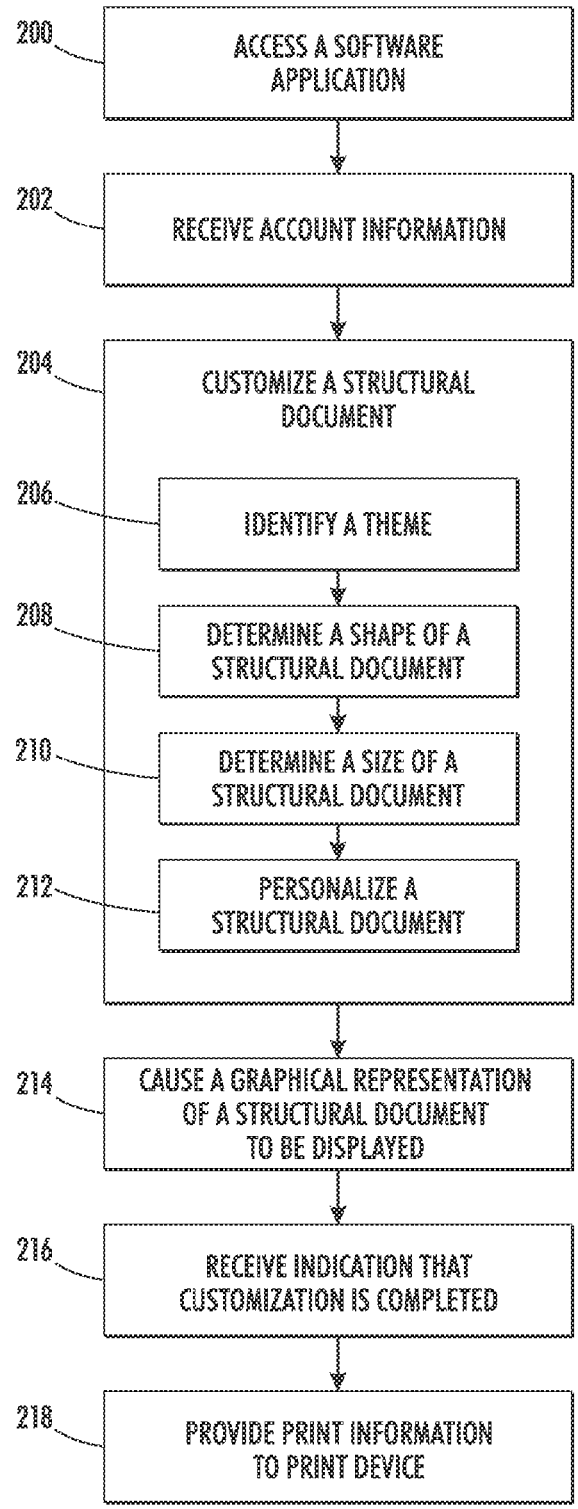
FIG. 2 illustrates a flow diagram of an illustrative method of generating a structural document according to an embodiment.

FIG. 2 illustrates a flow diagram of an illustrative method of generating a structural document according to an embodiment. As illustrated by FIG. 2, a user computing device may access 200 a software application hosted by a host computing device. In an embodiment, a user computing device may access 200 a software application via another application such as a web browser. For example, a user of a user computing device may enter or select a URL in a web browser to access 200 a software application. Similarly, a user of a user computing device may click, highlight or otherwise select a hyperlink or other link which may provide the user computing device access to a software application.

In an embodiment, a host computing device may receive 202 account information from a user computing device. The account information may include information unique to a user, such as a username, password, name, address, email address, zip code, phone number and/or the like. For example, a user may provide a username and/or password to access a software application. In an alternate embodiment, a user computing device may access a software application without providing account information.

In an embodiment, a user may be able to access a host computing device to customize 204 a structural document. In an embodiment, a user may customize a structural document by identifying 206 a theme associated with a structural document. A theme may relate to the purpose for which the structural document is being created. Examples of themes may include, without limitation, personal events, commercial offerings and gift wrapping. Personal events may refer to occasions pertinent to a user, such as, for example, a birthday, an anniversary, a wedding, a graduation, a sports team victory, or other personal milestone. A commercial offering refers to structural documents that promote a business, organization or other group. A commercial offering may include, without limitation, business cards, advertisements, promotions, favors, gifts and/or the like. In an embodiment, gift wrapping refers to structural documents meant to serve as containers for user-provided content.

In an embodiment, a user may be able to identify one or more sub-themes within an identified theme. For example, if a user identifies a personal event theme, the user may further select a sub-theme such as, for example, birthdays, anniversaries, weddings, graduations, and/or the like.

Figure 3:
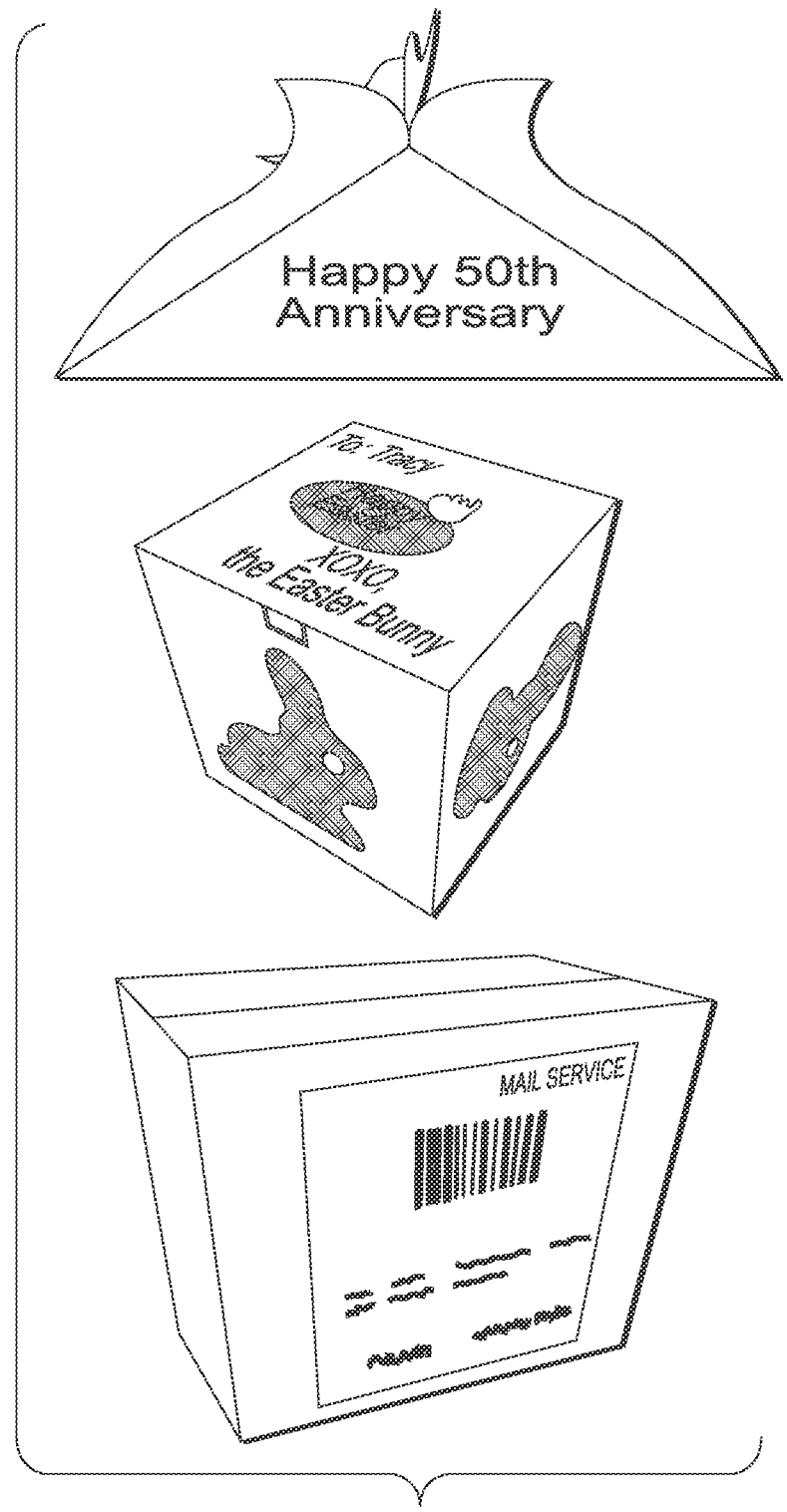
FIGS. 3-5 illustrate examples of structural documents according to embodiments.
Figure 4:
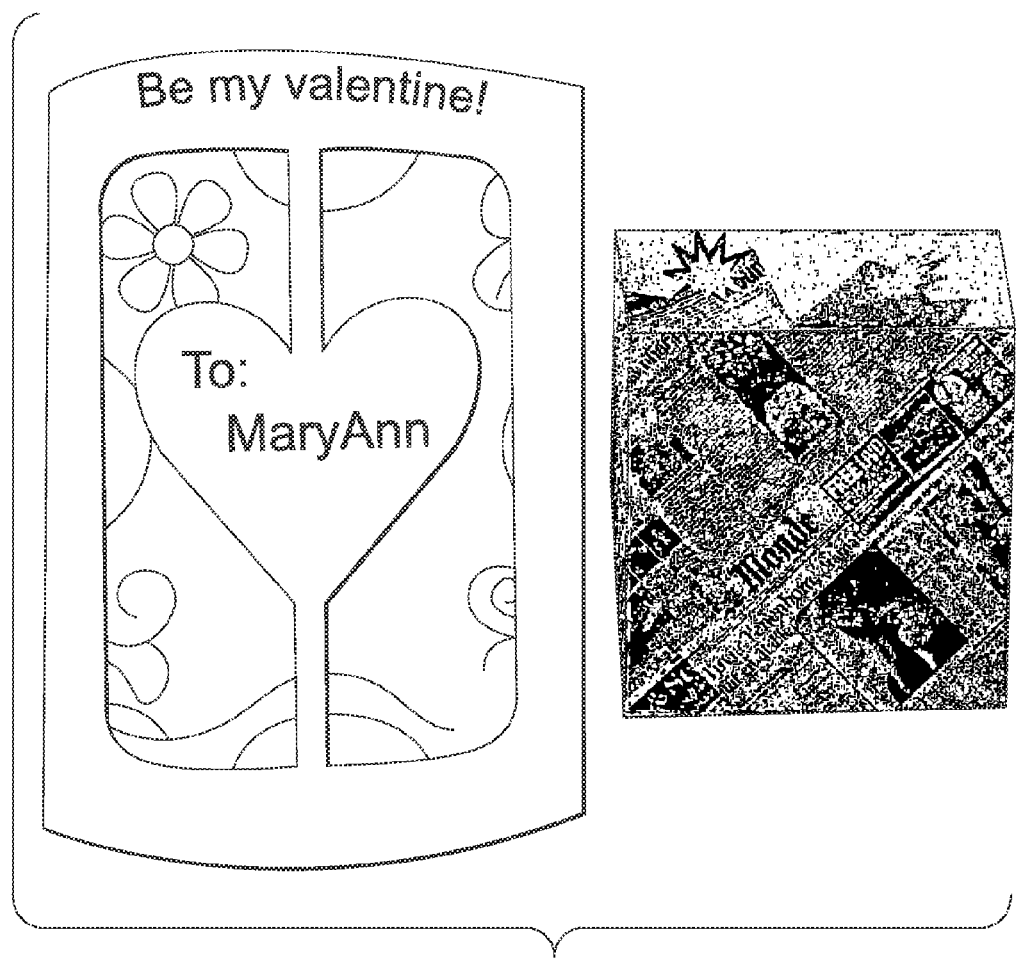
Figure 5:
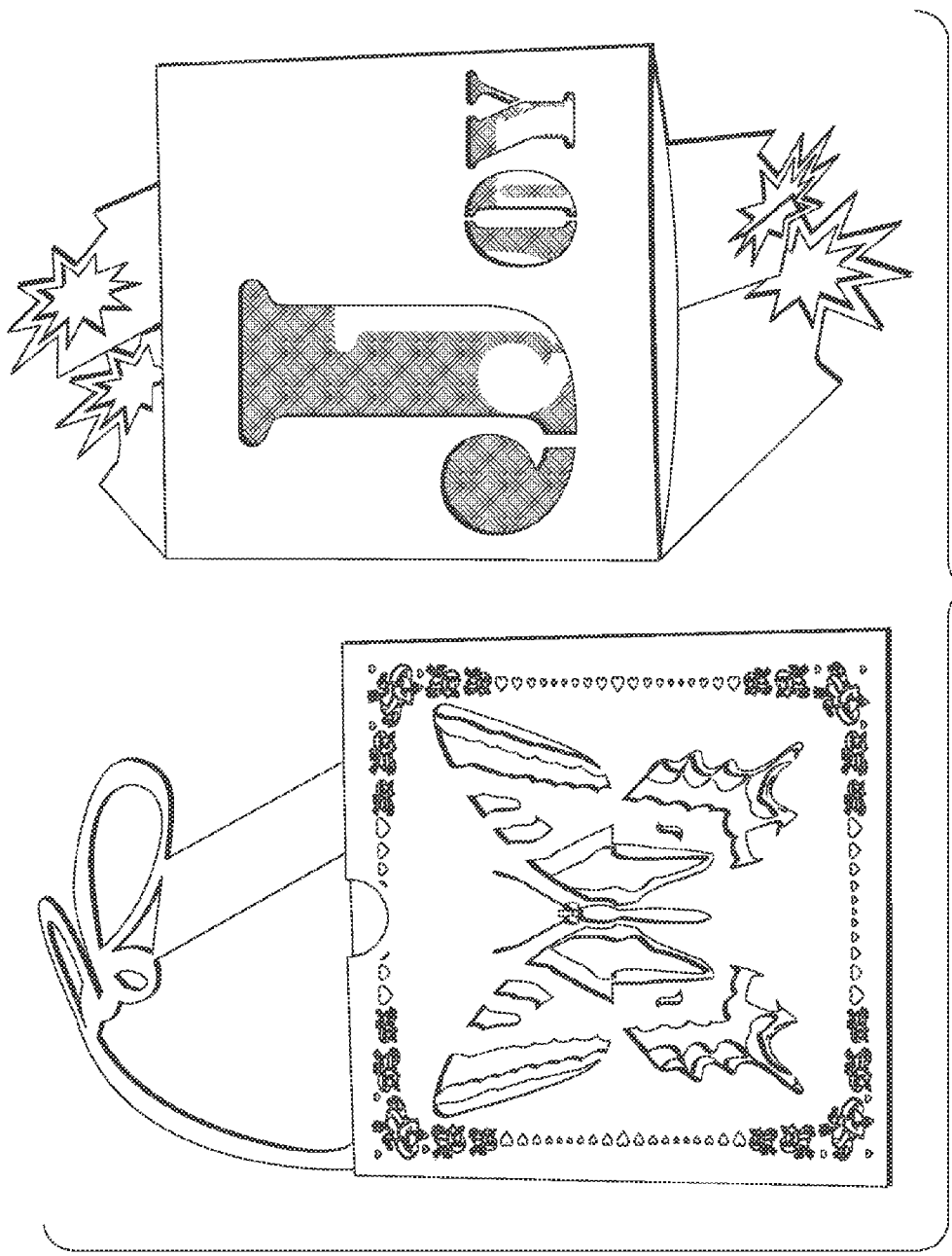

A user may customize 204 a structural document by identifying 208 a three-dimensional shape of a structural document. In an embodiment, a host computing device may cause a graphical representation of one or more structural documents and/or portions of one or more structural documents to be displayed to the user. For example, a host computing device may display one or more graphical representations of structural documents from which a user may select. The displayed graphical representations may be of a subset of available structural documents. For example, the displayed graphical representations may be of the most popular structural documents. Alternatively, the displayed graphical representations may be of all available structural documents. In another embodiment, one or more structural document components may be displayed, and a user may select the components to combine to create a graphical representation of a structural document. For example, different structures such as lids, bottoms, tabs and/or the like may be displayed, and a user may mix and match components to create a structural document. FIGS. 3-5 illustrate examples of structural documents according to an embodiment.

In an embodiment, a host computing device may determine 208 a shape of a structural document. Example shapes of structural documents may include, for example, a cube, a pyramid, a geodesic n-sided sphere, a sphere and/or the like. A host computing device may determine 208 a shape of a structural document based on a selection of a structural document by a user. For example, a user may identify a shape of a structural document by selecting and/or providing an indication of the desired shape. For instance, a user may enter a name of a desired shape, such as for example, by typing the name of a desired shape into a user interface. As another example, a user may identify a shape of a structural document by selecting a shape from a list, such as, for example, by selecting a shape from a drop down menu, by selecting button, radial button or other icon associated with a shape, and/or the like. In an embodiment, a host computing device may determine 208 a shape of a structural document based on a selection of a theme and/or sub-theme associated with a structural document. The client device may receive a user selection and may send an indication of the selection to a host computing device. The host computing device may receive the indication.

In an embodiment, a host computing device may determine 210 a size associated with a structural document. A size may refer to one or more dimensions of a structural document. A host computing device may determine 210 a size associated with a structural document based on a selection of size information by a user. In an embodiment, the host computing device may cause size information corresponding to a structural document to be displayed to the user, and the user may select size information from that which is displayed. For example, a host computing device may cause available dimensions of a structural document to be displayed to a user. The user may select the desired dimensions from the displayed dimensions, and the selection may be received by the host computing device. In an embodiment, a host computing device may determine 210 a size of a structural document based on a selection of a theme and/or sub-theme associated with a structural document.

Displayed size information may be based on, at least in part, the shape of the structural document as determined 208 by the host computing device. For example, certain structural document shapes may only be available in a certain number of sizes. In an embodiment, sizes and/or dimensions may refer to one or more measurements associated with a structural document, such as a length, width, height and/or volume of a structural document. In an alternate embodiment, sizes and/or dimensions may refer to general indication of a size, such as "small," "medium," "large," and/or "extra-large." General indications of size may be associated with one or more measurements of length, width, height and/or volume. For example, a "large" cube may be associated with a defined length, width, height, volume and/or other measurements.

In an alternate embodiment, a user may input size information via a user interface of a user computing device. For example, a user may enter one or more dimensions associated with a structural document. The user computing device may receive the input size information, and may send this information to a host computing device.

In an embodiment, a size and/or a shape of structural document may be determined 208, 210 based on information provided by a user regarding the content or contents of the structural document. A user may customize a structural document to contain one or more items. For example, a user may customize a structural document to contain a birthday present. A size and/or a shape of a structural document may be determined to conform to the shape and size of the contents. In an embodiment, a user may provide information pertaining to the contents of a structural document. This information may include the dimensions of the content, the size of the content, the shape of the content, the weight of the content and/or the like. The information may include one or more graphical representations of the content or contents. For example, a user may upload a picture of the contents of a structural document to the host computing device. The host computing device may analyze the picture to determine the content's size, shape, dimensions and/or the like.

In an embodiment, a host computing device may use the provided content information to determine 208, 210 a size and/or a shape of a structural document. In an embodiment, graphical representations of the one or more identified structural documents may be displayed to a user. The user may select a graphical representation of a structural document to customize, and this selection may be received by the host computing device. In an alternate embodiment, a host computing device may identify a structural document based on the content information without receiving a selection from a user.

In an embodiment, a host computing device may personalize 212 a structural document. A host computing device may personalize a structural document based on information provided by a user. For example, a user may identify one or more content items to include on a structural document. A content item may include a picture, a graphic, text, a background, a pattern, a shading, shadowing, a color, a color scheme, a font, a line type, embossing, a cutout, a monogram, a silhouette and/or the like. A content item may include one or more tab attributes, lid attributes, bottom attributes and/or other attributes associated with the structural document.

In an embodiment, a content item may be a brand identifier. A brand identifier may be a trade name, a trademark, a logo and/or another identifier associated with a provider of a good and/or service. For example, a product provider may create one or more structural documents to serve as packaging for a good. The product provider may choose to include it's name and/or logo on the structural document to identify itself as the provider of the good. In an embodiment, a user may provide one or more brand identifiers, such as, for example, by uploading a copy of its trademark and/or logo to the system. The user may determine where a brand identifier should be located on a structural document, a size associated with a brand identifier and/or the like.

Figure 6:
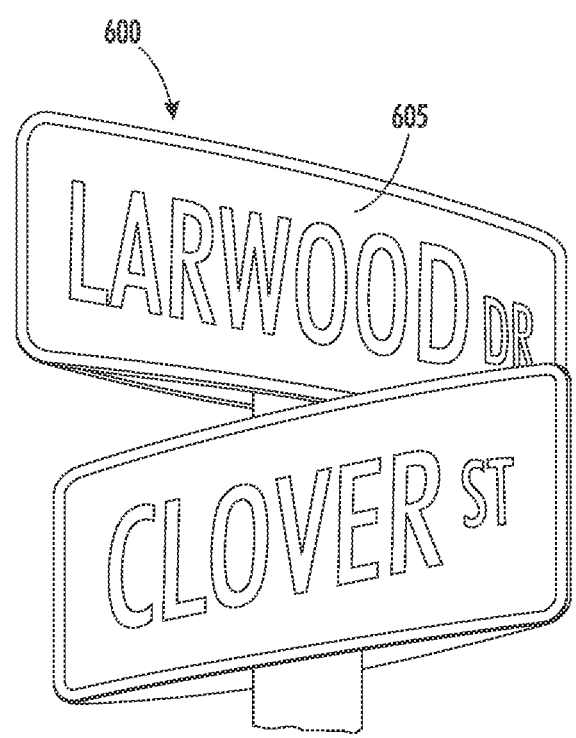
FIG. 6 illustrates an example of a graphical representation according to an embodiment.

In an embodiment, a host computing device may cause one or more candidate content items to be displayed to a user at a user computer computing device. A candidate content item may be a content item that is available for selection by a user. The host computing device may enable a user to select one or more candidate content items to include on one or more portions of a structural document. For example, a user may select a group of content items. In an embodiment, a host computing device may determine a position of a selected content item or items on a portion of a graphical representation of a structural document. For example, a user may select a portion of a structural document and may select a content item to include on that portion. In an embodiment, a user may select a content item and may drag and drop the selected content item to a particular location on the graphical representation of the portion. The selected content item may be displayed to a user at the particular location of the graphical representation of the portion. In an embodiment, a content item may be displayed on a graphical representation such that the content item has an appropriate orientation relative to the portion of the graphical representation on which it is displayed. For example, a graphical representation may include a picture of street signs 600 such as that illustrated in FIG. 6. As shown in FIG. 6, the size of the street sign 600 appears to shrink the further away it is from the viewer. In an embodiment, a displayed content item, such as the text 605 illustrated in FIG. 6, may be displayed in the same orientation.

In an embodiment, a graphical representation of a structural document may include one or more background content items and/or one or more customizable areas. A background content item may be a content item that cannot be changed, altered or modified by a user. A customizable area may be a portion of graphical representation of a structural document that a user may customize. A user may select one or more content items to be positioned in at least a portion of the customizable area. For example, a graphical representation of a birthday box structural document may include a background content item that reads "Happy Birthday" and a customizable area in which a user can enter the recipient's name. In an alternate embodiment, a graphical representation of a structural document may not include any background content items and may be entirely customizable.

In an embodiment, a user may be allowed to change the position of the content item within a graphical representation of a structural document. For example, a user may shift a position of a content item from one portion of a graphical representation of a structural document to another portion. As another example, a user may enlarge, shrink or otherwise change the size of the selected content item.

In an embodiment, a user may select a content item by selecting an image with a keyboard, a mouse and/or another pointer or input device. The user may drag and drop the selected content item on a portion of the structural document displayed using the software application. In another embodiment, a user may select a portion of a structural document by clicking on the portion of the graphical representation of the structural document. In an embodiment, a selection of one or more content items may be received by the host computing device. In an embodiment, the host computing device may receive one or more content items from a user computing device.

In an embodiment, a host computing device may receive one or more content items from a user. For example, a user may provide one or more content items to include on the structural document. For example, a user may upload a picture or other image from the user's computing device, remote storage device and/or the like to the host computing device. For example, if content items are stored locally on a user device, the user may be able to use a browse function to locate and select the content items. In an embodiment, if content items are stored on an unsecured website, the user may be able to use a browsing function to the website address associated with the site to locate and select the content items.

In an embodiment, a user may import a content item to include on the structural document from another server, computing device, software application, and/or the like. For example, a user may import names from a class roster that is stored as a spreadsheet rather than manually entering the names. Additional and/or alternate information and formats may be used within the scope of this disclosure.

In an embodiment, one or more content items may be provided to a host computing device via one or more third parties associated with a user. A third party may be a social networking site, a social media site, a cloud-based service and/or the like. For example, a user may upload pictures from a social networking site to which a user belongs to a host computing device. A third party may need to authenticate a user and/or authenticate the host computing device. In an embodiment, a user may be required to authorize the host computing device to access their information.

In an embodiment, a user may be able to modify, alter and/or customize one or more content items and/or characteristics of a content item. For example, a user may change the size of a content item. Similarly, a user may customize the color, shadowing, pattern, background and/or the like of a graphical representation of a structural document. Similarly, a user may also modify or alter the font or style of text used.

In an embodiment, the host computing device may cause a selected content item to be displayed on a selected portion of the structural document. For example, if the host computing device receives a selection of an image of a baseball to include on a portion of a structural document, the host computing device may cause the image of the baseball to be displayed on this portion of the graphical representation of the structural document.

In an embodiment, the host computing device may enable a user to insert text into one or more portions of a graphical representation of a structural document. For example, a user may be able to enter text into a selected portion of a structural document via a keyboard, a graphical representation of letters, a touch screen keyboard and/or the like. The entered text may be received by the host computing device. In an embodiment, the host computing device may cause the received text to be displayed on at least a portion of the graphical representation of the structural document.

In an embodiment, a user may personalize 212 a structural document by electing to include contact information on the structural document. Contact information may include information pertaining to a method by which and end user of the structural document or contents of the structural document, may contact the product provider of the structural document and/or contents of the structural document. For example, a product provider of widgets may create a structural document to serve as a container for its widgets. The product provider may choose to include contact information on the structural documents that an end user of a widget may use to contact the product provider.

In an embodiment, contact information may include a website associated with the product provider, an email address associated with the product provider, a mailing address associated with the product provider and/or other information pertaining to a way or ways through which a product provider may be contacted. In an embodiment, at least a portion of the contact information may be embodied in an encoded data mark that may be printed on a portion of a structural document. In an embodiment, an encoded data mark may be a one-dimensional bar code, a two-dimensional bar code, a QR code, a printable radio-frequency identification code and/or the like. In an embodiment, when an end user scans the encoded data mark using a scanner, such as, for example a mobile device, the end user may access a webpage associated with the product provider where the end user may be able to provide and/or receive information relating to the structural document and/or its contents. This process is described in more detail below.

In an embodiment, contact information may be provided to the host computing device by a user computing device. In an embodiment, a user may specify where on the structural document the contact information is to be printed. The user may select or otherwise identify a location on the graphical representation where the contact information should be located. In an embodiment, a user may specify a size associated with the contact information to be included on a structural document. For example, a user may select one or more dimensions associated with an encoded data mark to be included on the structural document. As another example, a user may identify the size font associated with an address, email address, website address and/or the like.

In an embodiment, a user may edit, modify, delete and/or otherwise customize the location or position of the selected content items on the graphical representation of the structural document. In an embodiment, any edits, modifications, deletions and/or other changes made by a user may be received by the host computing device.

In an embodiment, the graphical representation and/or selected content items may be resized so that they provide a to-scale view when displayed. In an embodiment, a host computing device may cause 214 a graphical representation of a structural document to be displayed to a user at the user's client device. The graphical representation may be moved, rotated about any of its axes, or otherwise shifted to provide a user with different views of the graphical representation. A user may be able to control the movement of or the viewing angle of the graphical representation. In an embodiment, the graphical representation may be displayed to scale. A graphical representation may be a three-dimensional graphical representation of at least a portion of a structural document. In an embodiment, a graphical representation may be a two-dimensional graphical representation of at least a portion of a structural document. For example, a graphical representation may be a two-dimensional side, top or bottom view of a structural document. Additional and/or alternate graphical representations may be used within the scope of this disclosure.

In an embodiment, a user may be permitted to change one or more features of the structural document. For example, a user may change the shape, size, content item, and/or make other changes to the structural document. These changes may be reflected in the three-dimensional graphical representation that is displayed.

In an embodiment, when the user has finished designing the structural document, the host computing device may receive 216 an indication from the user that the customization process is complete. For example, the user may select a button, icon, picture and/or the like, and an indication may be sent from the client device to the hosted computing device.

In an embodiment, a structural document may be designed by someone other than a user. For example, the system may enable a user to employ the design services of a third party designer, such as a graphic designer, an artist or another person or persons. A user may provide a description of a structural document to be designed to the system, and the system may transmit the description to one or more third party designers. Alternatively, the system may allow a user to communicate directly with a third party designer. The description may be a written description, such as a text file, an image, a picture, an email and/or the like. Alternatively, the description may be an audio file that includes a verbal description of a structural document. The description may include one or more features of a structural document. A third party designer may develop a graphical representation of a structural document that a user may be able to access via the system.

In an embodiment, a host computing device may compute how many sheets of media are required to create a structural document. The number of sheets may depend on the size and/or shape of the structural document, the quantity associated with the structural document and/or the like. In an embodiment, if the quantity of structural documents ordered by a user will result in excess media that may be used to create one or more additional structural documents, the host computing device may cause a user computing device to ask a user whether the user would like to order additional structural documents. For example, if a user orders one cube structural document, but two cube structural documents may be created from a single piece of media, the host computing device may ask a user whether he or she would like to order an additional structural document. In an embodiment, the cost of the additional structural document may be discounted.

In an alternative embodiment, if the quantity of structural documents ordered by a user will result in excess media that may be used to create one or more additional structural documents, the host computing device may cause a user computing device to ask a user whether the user is willing to wait a certain period of time to receive his or her structural document. For example, if the host computing device is aware of an order for a structural document that will utilize the remaining piece of media in two days, the host computing device may ask the user whether the user is willing to wait two days to receive his or her structural document. If the user indicates "yes," the cost of the structural document may be discounted. If the user indicates "no," the cost of the structural document may not be discounted.

In response to receiving an indication that the design process is complete, print-related information may be provided 218 to one or more print-related devices. Print-related information may pertain to how a graphical representation is to be printed, folded, cut and/or the like on a physical medium. Print-related information may include, without limitation, cut, crease, glue and fold information.

Figure 8:
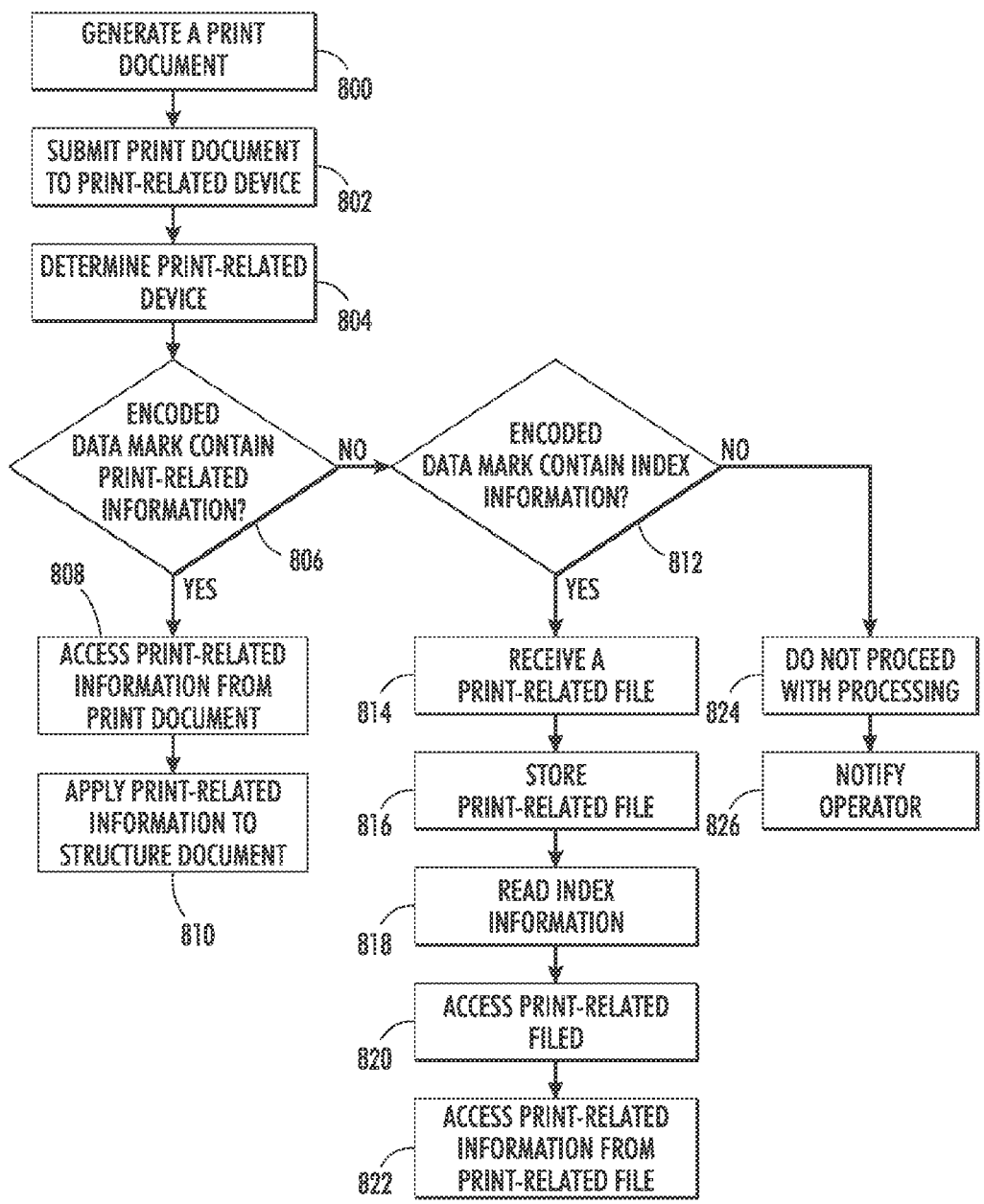
FIG. 8 illustrates a flow diagram of an illustrative method of providing print-related information to one or more print-related devices according to an embodiment.
Figure 9:
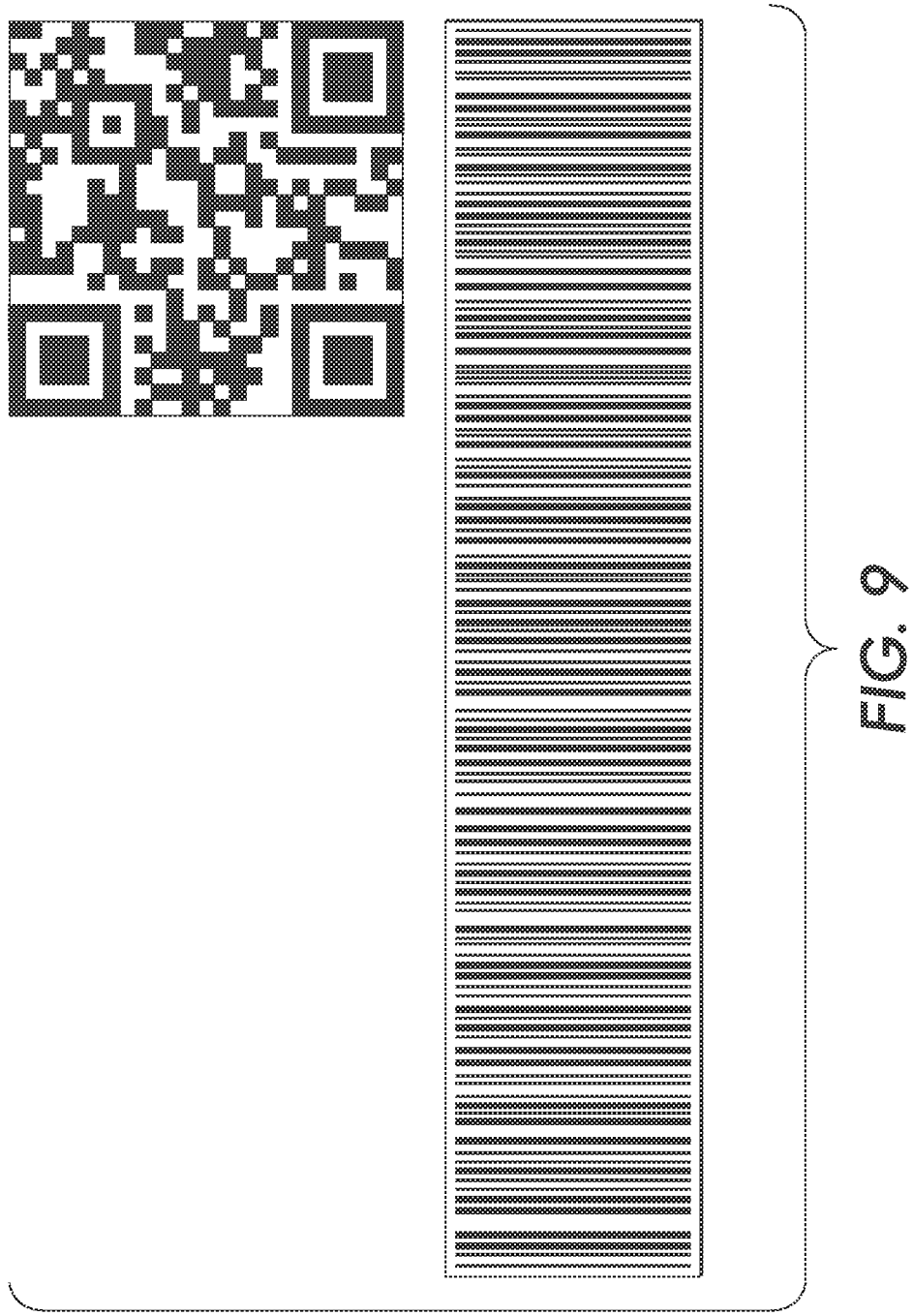
FIG. 9 illustrates examples of encoded data marks according to an embodiment.

FIG. 8 illustrates a flow chart of a method for providing print-related information to one or more print-related devices according to an embodiment. As illustrated by FIG. 8, a host computing device may generate 800 a print document associated with the structural document that contains print-related information. A print document may include an encoded data mark, such as, for example, a one-dimensional bar code, a two-dimensional bar code, a QR code, a printable radio-frequency identification code and/or the like. FIG. 9 illustrates examples of encoded data marks according to an embodiment. In an embodiment, print-related information may be embodied in the encoded data mark. In an alternate embodiment, the encoded data mark may include index information that a print-related device can use to access relevant print-related information for the structural document. In an embodiment, a host computing device may instruct a print device to print the print document.

In an embodiment, the print document may be submitted 802 to a print-related device, such as a finisher, and the print-related device may use at least a portion of the print-related information from the print document to generate a structural document. For example, an operator may use a finishing device to scan a print document. In an embodiment, a print document may be automatically read by a finishing device. For example, a print document may be placed in a tray of a finishing device, and may be automatically processed by the finishing device. In an alternate embodiment, a print document may be provided to a finishing device in a manual and/or semi-manual manner. The finishing device may read the print-related information from the print document, and may perform one or more cutting, creasing, folding and/or other finishing operations in accordance with the print-related information to generate a structural document.

In an embodiment, a host computing device may determine 804 which print-related device to submit a print document to. The host computing device may determine 804 a print-related device to submit a print document to based at least in part on one or more capabilities and/or capacities of a print-related device. In an embodiment, a capability of a print-related device may refer to a function that is performable by a print-related device such as, for example, cutting. In an embodiment, a capacity of a print-related device may refer to a maximum and/or minimum size media that the print-related device is able to process.

In an embodiment, a host computing device may store information pertaining to the capabilities and/or capacities of one or more print-related devices in communication with the host computing device. The host computing device may determine from the print-related related information one or more capabilities and/or capacities needed to create a corresponding structural document, and may send a print-related document to a print-related device that is capable of satisfying the capabilities and/or capacities.

In an embodiment, if an encoded data mark of the print document contains print-related information 806, the print-related device may access 808 print-related information from the print document. The print-related device may apply 810 the print-related information to the structural document.

In an embodiment, if an encoded data mark of the print document contains index information rather than print-related information 812, the print-related device may receive 814 a print-related file containing at least a portion of print-related information associated with the structural document. In an embodiment, the print-related device may receive 814 a print-related file via one or more electronic communication methods. A host computing device may generate a print-related file that includes at least a portion of print-related information corresponding to a structural document. The host computing device may transmit the print-related file to the print-related device. For example, a print-related file may be sent to a print-related device via a network, such as, for example, the Internet. A print-related file may also be provided to a print-related device via a computer-readable storage medium, such as, for example, a USB device.

In an embodiment, the print-related device may store 816 the received print-related file. When the print-related device processes the encoded data mark from the print-related document, the print-related device may read 818 the index information contained within the encoded data mark, and may use this index information to access 820 the corresponding print-related file. The print-related device may access 822 the corresponding print-related information from the print-related file. For example, a print document may be scanned by a finishing device, and the finishing device may obtain, from the encoded data mark, index information corresponding to a print-related file. The finishing device may use the index information to access 820 the print-related file, and may access 822 print-related information from the corresponding print-related file.

In an embodiment, if the encoded data mark of the print document does not contain print-related information and does not contains index information rather than print-related information 824, then a print-related device may not proceed 826 with processing the structural document. If the encoded data mark does not contain print-related information and does not contains index information, then an error or fault may have occurred, and the print-related device may not receive print-related information needed to print and/or finish a structural document. As such, the print-related device may stop processing and may notify 826 an operator of the error or fault by, for example, displaying a visual and/or audible alert.

In an embodiment, the completed structural document may be provided to a customer and/or end user. For example, a completed structural document may be provided to a customer and/or end user after the print-related information has been applied to the print. The structural document may be mailed or otherwise shipped directly to a customer and/or end user. In an embodiment, a structural document may be sent to a retail establishment or other location where it may be provided to an end user.

Figure 10:
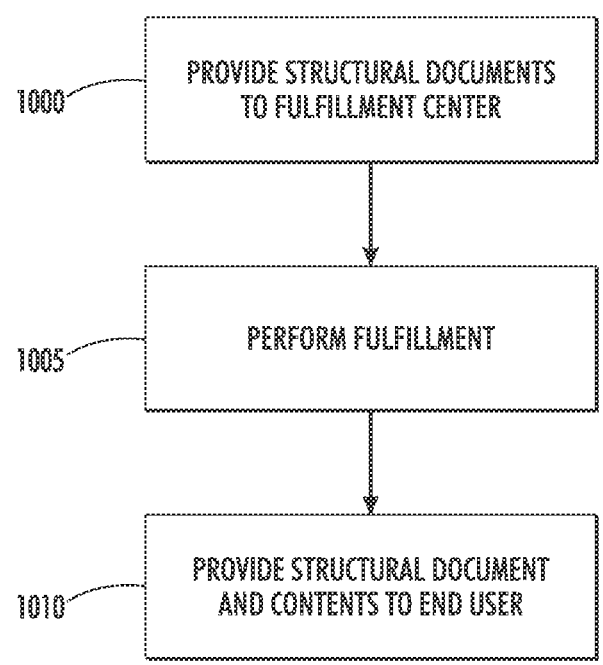
FIG. 10 illustrates a flow chart of an example method of fulfillment according to an embodiment.

In an embodiment, one or more products may be placed within the structural document and provided to one or more end users. For example, if a structural document is a package for one or more products, the products may be placed within the structural document and provided to an end user. FIG. 10 illustrates a flow chart of an example method of fulfillment according to an embodiment. As illustrated by FIG. 10, one or more structural documents may be provided 1000 to a fulfillment center. A fulfillment center may be a location, an organization, an entity and/or the like responsible for managing fulfillment. In an embodiment, a fulfillment center may be the same entity that creates a structural document. In another embodiment, a fulfillment center may be a different entity. In this situation, one or more structural documents may be shipped or otherwise sent to a fulfillment center after they are created. In an embodiment, flat sheets and/or assembled structural documents may be provided to a fulfillment center. In an embodiment, if a structural document is provided as a flat sheet, a fulfillment center may burst the structural document from the flat sheet, fold the structural document, glue the structural document and/or otherwise assemble the structural document.

In an embodiment, fulfillment may be performed 1005. Fulfillment may involve inserting one or more products into a structural document. In an embodiment, products may be placed within a structural document by a user, such as a product provider, a manufacturer and/or the like. Alternatively, contents may be placed within a structural document by a third party pursuant to an agreement between the third party and a product provider. In an embodiment, the entity that generates a structural document may be responsible for placing one or more products within a structural document. In an embodiment, fulfillment may include adding information related to the products to the structural document, such as, for example, inserting warranty information, directions, advertisements and/or the like into the structural document.

In an embodiment, the structural document and its contents may be provided 1010 to an end user. The structural document and its contents may be provided to an end user via regular mail or another shipping method. In another embodiment, the structural document and its contents may be provided to a retail or other establishment which may provide the structural document and its contents to an end user.

Figure 11:
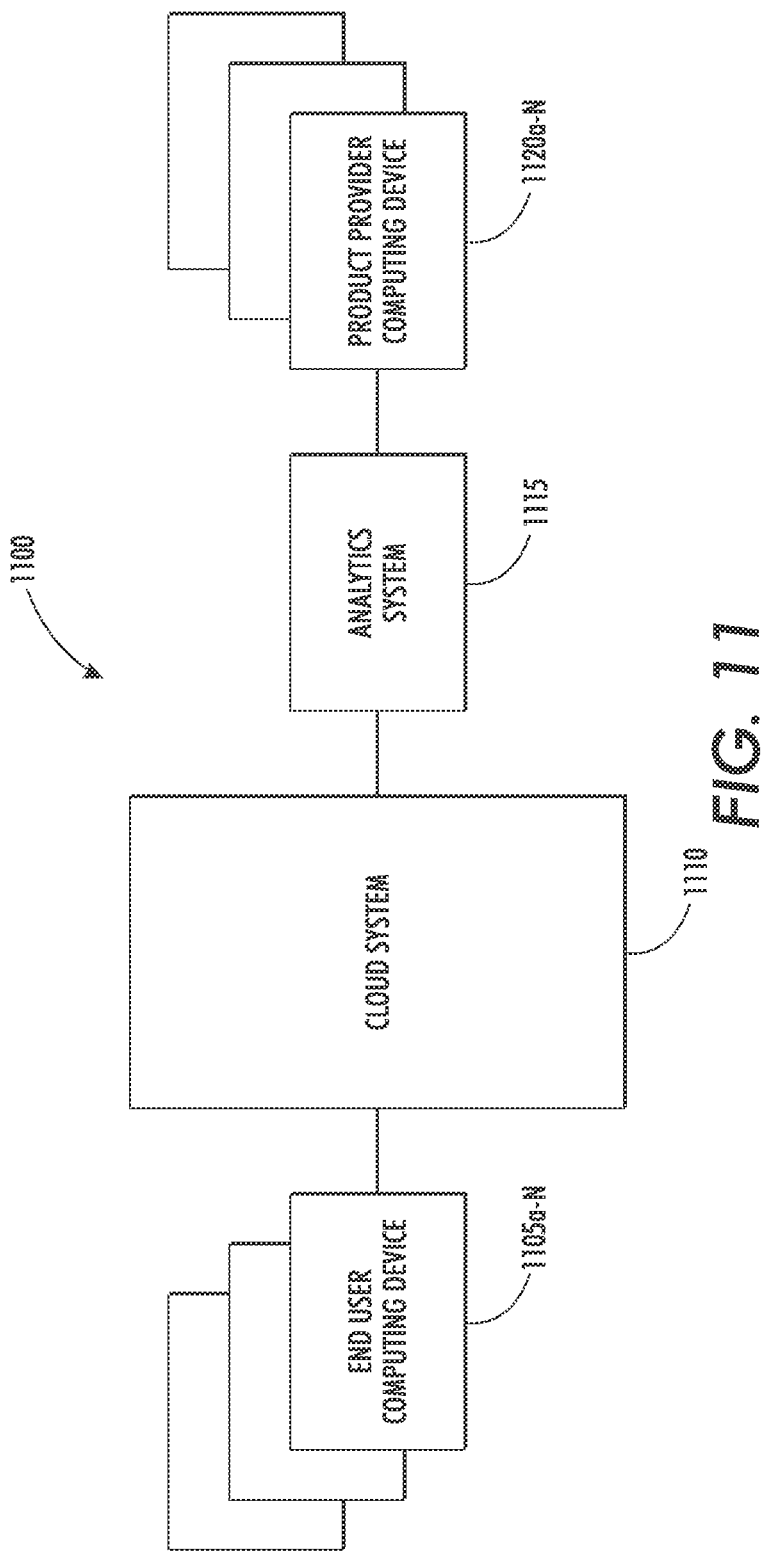
FIG. 11 illustrates an example of a product information system according to an embodiment.

In an embodiment, an end user may use the contact information from a structural document to access product information associated with either the structural document itself or one or more products contained within the structural document. FIG. 11 illustrates an example of a product information system 1100 according to an embodiment. As illustrated by FIG. 11, a product information system 1100 may include one or more end user computing devices 1105*a*-N, a cloud system 1110, an analytics system 1115 and one or more product provider computing devices 1120*a*-N. An end user computing device 1105*a*-N may be in communication with the cloud system 1110, and may send information to and receive information from the cloud system. The cloud system 1110 may be in communication with the analytics system 1115 and/or one or more of the product provider computing devices 1120a-N. Although FIG. 11 illustrates the analytics system 1115 as separate from the cloud system 1110, in an embodiment, the analytics system may be part of the cloud system 1110.

Figure 12:
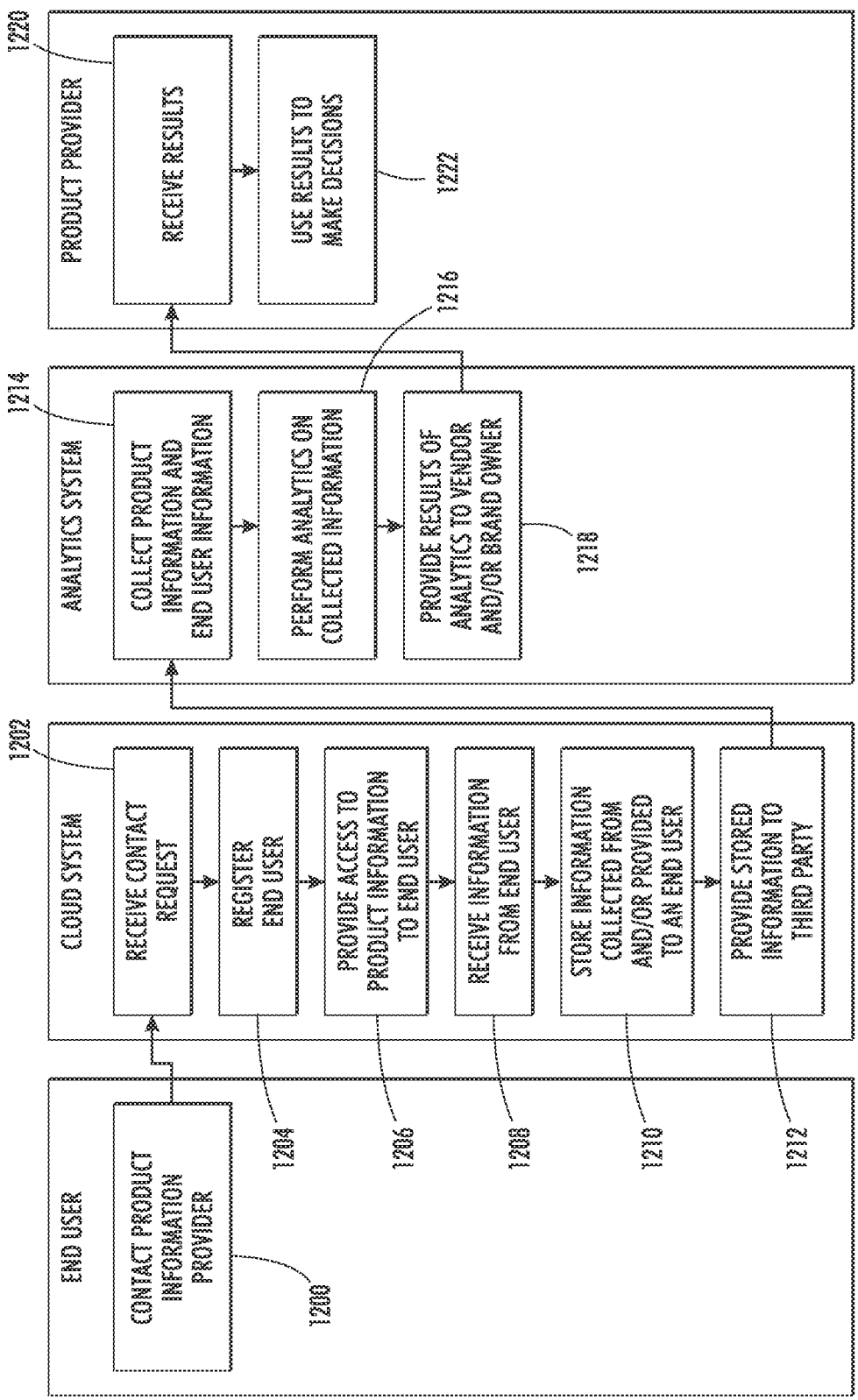
FIG. 12 illustrates a flow chart of an example method of accessing product information according to an embodiment.

FIG. 12 illustrates a flow chart of an example method of accessing product information according to an embodiment. As illustrated by FIG. 12, an end user may use the contact information of a structural document to contact 1200 a product information provider. A product information provider may be an entity responsible for collecting information from and/or providing information to end users that pertains to one or more structural documents and/or one or more products associated with the of one or more structural documents. A product information provider may be a product provider. In an embodiment, a product information provider may be another entity that contracts with the product provider to provide product information services to end users of one or more products.

In an embodiment, if the contact information includes a website address printed on the structural document, an end user may enter the website address into a browser to contact 1200 a product information provider. In an embodiment, if the contact information is a physical address, the end user may send correspondence to the physical address to contact 1200 a product information provider. Similarly, if the contact information is a phone number, an end user may call the phone number to contact 1200 a product information provider.

In an embodiment, if the contact information is embodied in an encoded data mark, an end user may scan the encoded data mark with a scanner to contact 1200 a product information provider. A scanner may be a bar code scanner, a QR scanner and/or the like. In an embodiment, a mobile device, such as a mobile phone, may have software that causes the mobile device to operate as a scanner. As such, a mobile device may be used to scan an encoded data mark.

In an embodiment, an address or other identifier associated with a website may be embodied within an encoded data mark. When an end user scans the encoded data mark, the website associated with the address or identifier embodied in the encoded data mark may be displayed to the end user. In an embodiment, the website may be displayed to an end user on the device used as the scanner. For example, if an end user used his or her mobile device to scan an encoded data mark, a website associated with the address embodied in the encoded data mark may be displayed on the end user's mobile device. In an embodiment, the website may be displayed to an end user on a device in communication with the device used as the scanner. For example, if an end user uses a scanner in communication with a computer to scan an encoded data mark, a website associated with the address embodied in the encoded data mark may be displayed on a display of the computer.

In an embodiment, an end user may contact a product information provider via a cloud system. An end user computing device may send a contact request to a cloud system associated with a product information provider. For example, if an end user scans a QR code of a structural document using an end user computing device, the end user computing device may send a contact request to the cloud system. The cloud system may receive 1202 the contact request. In an embodiment, the cloud system may register 1204 an end user. For example, the cloud system may provide an end user may have an option to register 1204 in order to access product information. This may entail the end user providing information, such as the end user's name, address, phone number, email address, username, password and/or the like, to the cloud system. Information provided by a user may be stored by, for example, the cloud system or memory accessible by the cloud system.

In an embodiment, an end user may be provided access 1206 to at least a portion of product information associated with the end user's structural document, products associated with the structural document and/or the like. In an embodiment, product information may include warranty information, product and/or product provider reviews, assembly instructions, information pertaining to related products, surveys, contests, discounts, rebates, or other information related to the structural document and/or its contents. For example, by scanning an encoded data mark, a user may access a website through which the user may activate a warranty, provide feedback on the product and/or the product provider, view additional product information, such as assembly instructions and/or the like. In an embodiment, an end user may be able to recreate orders through the website and/or view information pertaining to related products or services. In an embodiment, an end user may be able to view one or more product surveys via the website.

In an embodiment, a cloud system may receive 1208 information related to a structural document and/or its products from one or more end users. For example, an end user may complete a review of or a survey about a structural document and/or the products. The cloud system may receive 1208 and/or store 1210 received information.

In an embodiment, a cloud system may be managed or operated by a product provider. In an alternate embodiment, a cloud system may be managed or operated by a third party on behalf of a product provider. For example, a third party may be the same party that operates the host computing device illustrated in FIG. 1. In an embodiment, the third party may be a different party than the one that operates the host computing device.

In an embodiment, as illustrated by FIG. 12, the cloud system may provide 1212 at least a portion of the stored information to an analytics system. The analytics system may collect 1214 information pertaining to end users who contact product information providers. For example, a third party may collect information 1214 relating to an end user's location, demographics, purchase history, buying behavior and/or the like. The third party may aggregate, analyze and/or perform analytics 1216 on this information, and may provide and/or sell at least a portion of this information to a product provider to assist with future sales, marketing and/or the like. In an embodiment, an end user who does not want his or her information to be so collected, aggregated and/or analyzed may opt-out of this service, such as, for example, during registration.

In an embodiment, an analytics system may be operated and/or managed by a product information provider, a product provider and/or another person or entity. For example, an analytics system may be operated and/or managed by a vendor that collects and analyzes end user information on behalf of a product provider. In an embodiment, an analytics system may provide 1218 one or more results of its analysis of collected information to a product provider. For example, the analytics system may provide demographic information to a product provider regarding demographics of end users who purchased a certain product. Additional and/or alternate results may be used within the scope of this disclosure.

In an embodiment, a product provider may receive 1220 results from an analytics system, and may use 1222 the results to make one or more business decisions, such as marketing decisions.

Figure 7:
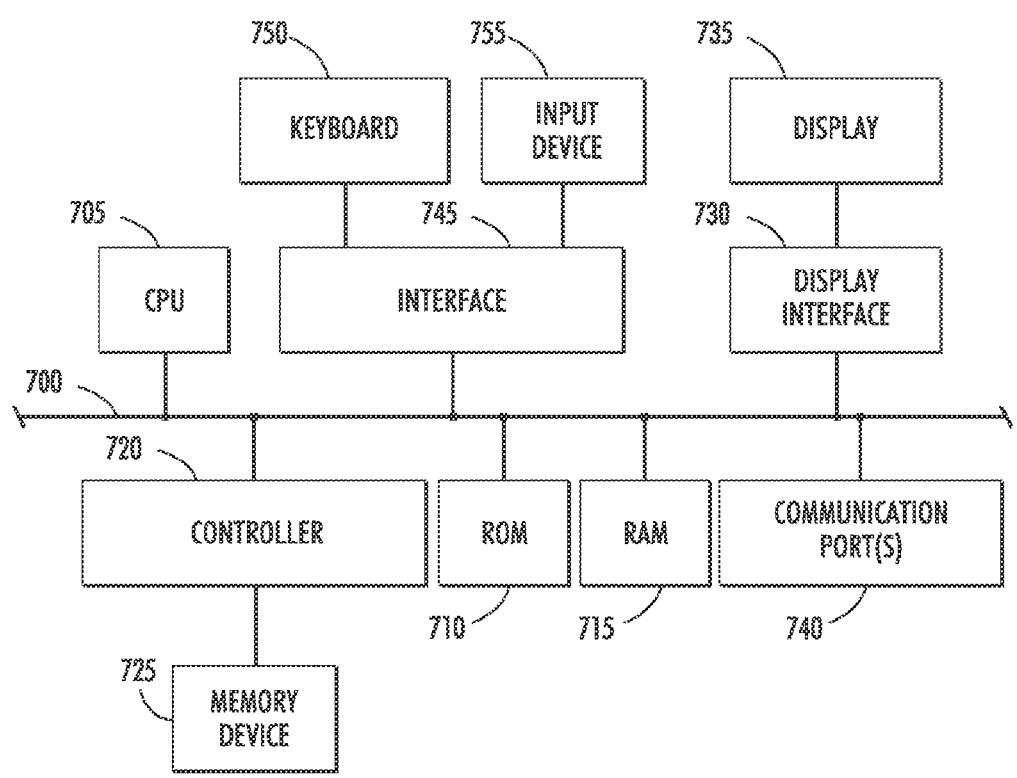
FIG. 7 illustrates a block diagram of hardware that may be used to contain or implement program instructions according to an embodiment.

FIG. 7 depicts a block diagram of hardware that may be used to contain or implement program instructions. A bus 700 serves as the main information highway interconnecting the other illustrated components of the hardware. CPU 705 is the central processing unit of the system, performing calculations and logic operations required to execute a program. CPU 705, alone or in conjunction with one or more of the other elements disclosed in FIG. 7, is an example of a processing device, computing device or processor as such terms are used within this disclosure. Read only memory (ROM) 710 and random access memory (RAM) 715 constitute examples of memory devices.

A controller 720 interfaces with one or more optional memory devices 725 to the system bus 700. These memory devices 725 may include, for example, an external or internal DVD drive, a CD ROM drive, a hard drive, flash memory, a USB drive or the like. As indicated previously, these various drives and controllers are optional devices.

Program instructions, software or interactive modules for providing the interface and performing any querying or analysis associated with one or more data sets may be stored in the ROM 710 and/or the RAM 715. Optionally, the program instructions may be stored on a tangible computer readable medium such as a compact disk, a digital disk, flash memory, a memory card, a USB drive, an optical disc storage medium, such as a Blu-ray™ disc, and/or other recording medium.

An optional display interface 730 may permit information from the bus 700 to be displayed on the display 735 in audio, visual, graphic or alphanumeric format. Communication with external devices, such as a printing device, may occur using various communication ports 740. A communication port 740 may be attached to a communications network, such as the Internet or an intranet.

The hardware may also include an interface 745 which allows for receipt of data from input devices such as a keyboard 750 or other input device 755 such as a mouse, a joystick, a touch screen, a remote control, a pointing device, a video input device and/or an audio input device.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method of creating a structural document, the method comprising:
    receiving, by a host computing device in a cloud system, content information pertaining to one or more contents that are to be encased by the structural document;
    determining, by the host computing device, a shape of a structural document based on the received content information;
    determining, by the host computing device, a plurality of dimensions of the structural document based on the received content information;
    receiving, by the host computing device, information associated with one or more content items, wherein each content item represents a visual characteristic associated with the structural document;
    receiving, via a communications network from a user computing device that is remote from the host computing device, contact information to include on the structural document, wherein the contact information corresponds to a product information provider associated with the structural document;
    receiving, by the host computing device, an indication of a location on the structural document where the contact information is to be displayed;
    causing a graphical representation of the structural document to be displayed at a user computing device, wherein a shape of the three-dimensional graphical representation corresponds to the determined shape, wherein a plurality of dimensions of the graphical representation correspond to the determined plurality of dimensions, wherein the contact information is displayed on the graphical representation at the location, wherein the graphical representation comprises at least a portion of the received content items;
    receiving, from the user computing device by the host computing device, an indication that a user is finished creating the structural document;
    generating a print document comprising an encoded data mark; and
    providing the print document to one or more print-related devices.

2. The method of claim 1, wherein receiving contact information comprises receiving a physical address of the product information provider associated with the structural document.

3. The method of claim 1, wherein receiving contact information comprises receiving an email address of the product information provider associated with the structural document.

4. The method of claim 1, wherein receiving contact information comprises receiving a website address of the product information provider associated with the structural document.

5. The method of claim 1, wherein:
    receiving contact information comprises:
        receiving a website address of the product information provider associated with the structural document, and
        generating a second encoded data mark that embodies the website address, and the second encoded data mark is displayed on the graphical representation at the location.

6. The method of claim 5, wherein one or more of the encoded data mark and the second encoded data mark comprises one or more of the following:
    a one-dimensional bar code;
    a two-dimensional bar code;
    a QR code; and
    a printable radio-frequency identification code.

7. The method of claim 5, wherein generating a second encoded data mark comprises:
    generating a second encoded data mark that embodies the website address such that scanning the second encoded data mark automatically causes a website associated with the website address to be displayed, wherein the website allows an end user to perform one or more of the following:
        activate a warranty associated with contents of the structural document,
        provide feedback pertaining to the contents,
        view production information associated with the contents, and
        complete a product survey relating to the contents.

8. The method of claim 1, wherein
receiving content information pertaining to one or more contents of a structural document comprises receiving one or more of the following:
one or more dimensions associated with the one or more contents,
a shape associated with the one or more contents,
a weight associated with the one or more contents, and
an image of the one or more contents.

9. The method of claim 1, wherein
receiving content information pertaining to one or more contents of a structural document comprises receiving one or more of the following:
one or more dimensions associated with the one or more contents,
a shape associated with the one or more contents,
a weight associated with the one or more contents, and
an image of the one or more contents.

10. The method of claim 1, further comprising:
transmitting a print-related file to the one or more print-related devices, wherein the print-related file comprises print-related information associated with the structural document, wherein the encoded data mark comprises a reference to the print-related file.

11. A system for creating a structural document, the system comprising:
a computing device;
a non-transitory computer-readable storage medium in communication with the computing device, wherein the computer-readable storage medium comprises one or more programming instructions that, when executed, cause the computing device to:
receive content information pertaining to one or more contents that are to be encased by the structural document,
determine a shape of a structural document based on the received content information,
determine a plurality of dimensions of the structural document based on the received content information,
receiving information associated with one or more content items,
receive contact information to include on the structural document, wherein the contact information corresponds to a product information provider associated with the structural document;
receive an indication of a location on the structural document where the contact information is to be displayed,
cause a three-dimensional graphical representation of the structural document to be displayed at a user computing device, wherein a shape of the three-dimensional graphical representation corresponds to the determined shape, wherein a plurality of dimensions of the three-dimensional graphical representation correspond to the determined plurality of dimensions, wherein the contact information is displayed on the graphical representation at the location, wherein the three-dimensional graphical representation comprises at least a portion of the received content items,
receive an indication that a user is finished creating the structural document,
generate a print document comprising an encoded data mark, and
provide the print document to one or more print-related devices.

12. The system of claim 11, wherein the one or more programming instructions that, when executed, cause the computing device to receive contact information comprise one or more programming instructions that, when executed, cause the computing device to receive a physical address of the product information provider associated with the structural document.

13. The system of claim 11, wherein the one or more programming instructions that, when executed, cause the computing device to receive contact information comprises one or more programming instructions that, when executed, cause the computing device to receive an email address of the product information provider associated with the structural document.

14. The system of claim 11 wherein the one or more programming instructions that, when executed, cause the computing device to receive contact information comprise one or more programming instructions that, when executed, cause the computing device to receive a website address of the product information provider associated with the structural document.

15. The system of claim 11, wherein:
the one or more programming instructions that, when executed, cause the computing device to receive contact information comprise one or more programming instructions that, when executed, cause the computing device to:
receive a website address of the product information provider associated with the structural document, and
generate a second encoded data mark that embodies the website address, and
the second encoded data mark is displayed on the graphical representation at the location.

16. The system of claim 15, wherein one or more of the encoded data mark and the second encoded data mark comprises one or more of the following:
a one-dimensional bar code;
a two-dimensional bar code;
a QR code; and
a printable radio-frequency identification code.

17. The system of claim 15, wherein the one or more programming instructions that, when executed, cause the computing device to generate a second encoded data mark comprise one or more programming instructions that, when executed, cause the computing device to:
generate a second encoded data mark that embodies the website address such that scanning the second encoded data mark automatically causes a website associated with the website address to be displayed, wherein the website allows an end user to perform one or more of the following:
activate a warranty associated with contents of the structural document,
provide feedback pertaining to the contents,
view production information associated with the contents, and
complete a product survey relating to the contents.

18. The system of claim 11, wherein the one or more programming instructions that, when executed, cause the computing device to
receive content information pertaining to one or more contents of a structural document comprise one or more programming instructions that, when executed, cause the computing device to receive one or more of the following:
one or more dimensions associated with the one or more contents,
a shape associated with the one or more contents,
a weight associated with the one or more contents, and
an image of the one or more contents.

19. The system of claim 11, wherein the one or more programming instructions that, when executed, cause the computing device to
receive content information pertaining to one or more contents of a structural document comprise one or more programming instructions that, when executed, cause the computing device to receive one or more of the following:
one or more dimensions associated with the one or more contents,
a shape associated with the one or more contents,
a weight associated with the one or more contents, and
an image of the one or more contents.

20. The system of claim 11, wherein the non-transitory computer-readable storage medium further comprises one or more programming instructions that, when executed, cause the computing device to transmit a print-related file to the one or more print-related devices, wherein the print-related file comprises print-related information associated with the structural document, wherein the encoded data mark comprises a reference to the print-related file.

* * * * *